United States Patent
Waki et al.

(10) Patent No.: US 10,081,065 B2
(45) Date of Patent: Sep. 25, 2018

(54) CUTTING TOOL AND METHOD FOR MANUFACTURING CUT PRODUCT USING SAME

(71) Applicant: KYOCERA Corporation, Kyoto-shi, Kyoto (JP)

(72) Inventors: Masahiro Waki, Satsumasendai (JP); Mari Imazato, Sasebo (JP); Tan Ka, Satsumasendai (JP)

(73) Assignee: KYOCERA CORPORATION, Kyoto-Shi, Kyoto (JP)

( * ) Notice: Subject to any disclaimer, the term of this patent is extended or adjusted under 35 U.S.C. 154(b) by 72 days.

(21) Appl. No.: 15/025,844

(22) PCT Filed: Sep. 30, 2014

(86) PCT No.: PCT/JP2014/076106
§ 371 (c)(1),
(2) Date: Mar. 29, 2016

(87) PCT Pub. No.: WO2015/046573
PCT Pub. Date: Apr. 2, 2015

(65) Prior Publication Data
US 2016/0243625 A1    Aug. 25, 2016

(30) Foreign Application Priority Data

Sep. 30, 2013 (JP) ................. 2013-204365
Jan. 29, 2014 (JP) ................. 2014-014431
May 28, 2014 (JP) ................. 2014-110313

(51) Int. Cl.
B23B 51/02  (2006.01)
B23B 35/00  (2006.01)
(Continued)

(52) U.S. Cl.
CPC .............. *B23B 51/02* (2013.01); *B23B 51/00* (2013.01); *C23C 16/0254* (2013.01);
(Continued)

(58) Field of Classification Search
CPC .. B23B 2226/31; B23B 51/02; B23B 2228/10
See application file for complete search history.

(56) References Cited

U.S. PATENT DOCUMENTS

2007/0104953 A1* 5/2007 Sugita ................. B23C 5/10
                                                    428/408
2008/0019787 A1* 1/2008 Sampath ............... B23B 51/02
                                                    408/230

FOREIGN PATENT DOCUMENTS

JP    63-33570 A    2/1988
JP    11-058106 A   3/1999
(Continued)

OTHER PUBLICATIONS

English translation of JP 201 21 61 873 A, Aug. 2012.*
(Continued)

*Primary Examiner* — Alan Snyder
(74) *Attorney, Agent, or Firm* — Volpe and Koenig, P.C.

(57) ABSTRACT

A cutting tool such as a drill (1) in which a coating layer (6) is provided to the surface of a base body (5) having a rod shape, which is equipped with a cutting edge (2) provided to at least the tip portion (A) of the base body (5) having a rod shape and a chip discharge section (4) provided adjacent to the cutting edge (2) so as to extend rearwards (i.e., towards the rear end) from the tip portion (A), the coating layer (6) comprising a mixture phase of diamond and graphite and having a diamond content ratio which is lower in a rear end located 10 mm rearward from the tip than in the tip portion (A).

5 Claims, 3 Drawing Sheets (51) Int. Cl.
*B23B 51/00* (2006.01)
*C23C 16/26* (2006.01)
*C23C 16/27* (2006.01)
*C23C 16/02* (2006.01)

(52) U.S. Cl.
CPC ............ *C23C 16/26* (2013.01); *C23C 16/271* (2013.01); *B23B 2226/31* (2013.01); *B23B 2228/04* (2013.01); *B23B 2228/10* (2013.01); *B23B 2228/56* (2013.01); *B23B 2251/408* (2013.01); *B23C 2226/31* (2013.01); *B23C 2228/10* (2013.01)

(56) References Cited

FOREIGN PATENT DOCUMENTS

| | | | |
|---|---|---|---|
| JP | 2003-80413 A | | 3/2003 |
| JP | 2010-194628 A | | 9/2010 |
| JP | 2012-139799 A | | 7/2012 |
| JP | 201 21 61 87 | * | 8/2012 |

OTHER PUBLICATIONS

Veres, M., et al., "Spatially resolved near-infrared excited Raman spectroscopy of nanocrystalline diamond films," Diamond and Related Materials (www.sciencedirect.com), Jan. 14, 2008, pp. 515-519.
International Search Report (Form PCT/ISA/210) dated Jan. 6, 2015, issued for PCT/JP2014/076106.

* cited by examiner

CUTTING TOOL AND METHOD FOR MANUFACTURING CUT PRODUCT USING SAME

TECHNICAL FIELD

The present invention relates to a cutting tool in which a coating layer is formed on the surface of a base body having a rod shape and to method for manufacturing a cut product using the cutting tool.

BACKGROUND ART

Cutting tools in which a coating layer made from diamond is formed as a film on the surface of the base body are a well-known technology. Patent Document 1, for example, discloses tools such as a drill or an end mill in which a diamond layer is formed as a film on the surface of a base body having a rod shape. Moreover, Patent Document 2 discloses a wear-resistant tool member in which an Si-containing diamond-like carbon film is formed on the surface of a base body, and the carbon film has a graded composition in which the Si content ratio changes in the thickness direction of the coating layer.

CITATION LIST

Patent Literature

Patent Document 1: Japanese Unexamined Patent Application Publication No. H11-058106A
Patent Document 2: Japanese Unexamined Patent Application Publication No. 2010-194628A

SUMMARY OF INVENTION

Technical Problem

However, in the drill that is coated with a diamond layer disclosed in Patent Document 1, the coating layer on the cutting edges on the tip side of the drill is prone to wear. Meanwhile, there has been increased demand for better chip discharge performance from the chip discharge grooves located rearward of the tip. Even when using the coating layer disclosed in Patent Document 2 in which the diamond-like carbon film has a graded composition in the thickness direction of the coating layer, it was not previously possible to satisfy both of the abovementioned requirements at the same time.

Therefore, the present invention aims to provide a cutting tool such as a drill or an end mill in which a cutting edge is formed in the tip of a base body having a rod shape and in which a coating layer exhibits the required performance for both the cutting edge and the chip discharge section.

Solution to Problem

A first embodiment of the cutting tool having a rod shape of the present invention includes a cutting edge being at least in a tip portion of the cutting tool and a chip discharge section being adjacent to the cutting edge and extending rearward from the tip portion. The cutting tool further includes a base body and a coating layer being on a surface of the base body and composed of a mixed phase of diamond and graphite. A diamond content ratio of the coating layer at a rear portion located 10 mm rearward of a tip is less than a diamond content ratio of the coating layer at the tip portion.

A second embodiment of the cutting tool having a rod shape of the present invention includes a cutting edge being at least in a front tip portion of the cutting tool and a chip discharge groove being adjacent the cutting edge and extending rearward from a tip. The cutting tool further includes a base body made from a hard alloy, the hard alloy containing a hard phase and a bonding phase and a coating layer being on a surface of the base body and containing diamond. A bonding phase content ratio at the surface portion of the base body at a tip section of the tip portion that includes the cutting edge is less than 0.9 times a bonding phase content ratio in an internal portion of the base body at a tip section. A bonding phase content ratio at the surface portion of the base body at a groove section that includes the chip discharge groove is from 0.9 to 1.1 times the bonding phase content ratio of the internal portion of the base body at a groove section. The surface of the base body either is exposed to an external environment or includes the coating layer on at least a portion thereof.

A third embodiment of the cutting tool of the present invention includes a base body having a central rotation axis and a cutting edge being at least from a center portion to a peripheral portion of the base body as viewed from a tip side thereof. The cutting tool further includes a coating layer being on a surface of the base body and contains diamond. An SP3 peak intensity ratio at the center portion is less than an SP3 peak intensity ratio at the peripheral portion when a Raman spectroscopy analysis is performed on a surface of the diamond layer in order to obtain a peak intensity ratio of an intensity of an SP3 peak to a total intensity of a peaks originating from the diamond.

Advantageous Effects of Invention

In the first embodiment of the cutting tool of the present invention, the diamond content ratio at the cutting edge in the tip portion of the base body is high, thereby increasing the hardness of the coating layer and making it possible to reduce wear on the coating layer formed on the cutting edge. Moreover, in the portion rearward of the tip portion of the base body (hereinafter, simply "rear portion"), the graphite content ratio is high. Diamond grains grow in polyhedral shapes, and therefore as the content ratio of diamond grains increases, recesses and protrusions are formed in the surface of the coating layer. Meanwhile, graphite does not negatively impact the smoothness of the coating layer even when formed as a film. Therefore, in the rear portion of the base body where the graphite content ratio is high, the surface of the coating layer is smooth, thereby improving chip discharge performance.

In the second embodiment of the cutting tool of the present invention, the content ratio of a bonding phase that impedes growth of the diamond layer is lower at the cutting edge than in the internal portion of the base body, thereby facilitating growth of the diamond layer and increasing the adhesion of the diamond layer to the surface. This makes it possible to reduce progression of wear on the cutting edge. Meanwhile, in the diamond layer that contains high-hardness diamond grains, the diamond grains grow in polyhedral shapes, and therefore the diamond grains grow protruding out from the surface of the diamond layer and form recesses and protrusions in the surface of the coating layer. However, the chip discharge performance of the chip discharge grooves must be improved, and therefore not having a diamond layer in the chip discharge grooves results in better cutting performance. Therefore, the adhesion of the diamond layer can be intentionally reduced in the chip discharge grooves so that the diamond layer is not formed thereon or so that the diamond layer peels off at an early stage. This makes the surface of the chip discharge grooves smooth and improves chip discharge performance.

In the third embodiment of the cutting tool of the present invention, the SP3 peak intensity ratio at the center portion of the base body as viewed from the tip side thereof (hereinafter, simply "center portion") is low. In other words, the μm-order diamond content ratio is low, and therefore the diamond grains that grow in polygonal shapes do not protrude out from the surface of the diamond layer and make the surface of the diamond layer rough. This makes it possible to keep the surface of the diamond layer flat at the center portion. Moreover, the hardness of the diamond layer on the center portion is low, and therefore the surface of the diamond layer at the center portion of the cutting edge becomes even flatter immediately after the initial cuts are made. This reduces cutting resistance at the center portion, thereby making it possible to prevent breakage of the tool. Meanwhile, the SP3 peak intensity ratio at the peripheral portions of the base body as viewed from the tip side thereof (hereinafter, simply "peripheral portions") is high. In other words, the μm-order diamond content ratio is high, and therefore the wear resistance of the diamond layer is high.

In other words, in the cutting tool of the present invention, at the cutting edges and particularly at the peripheral portions of the cutting edges, where higher wear resistance is required, the diamond content ratio is increased in order to increase wear resistance. Meanwhile, at the center portion of the base body as viewed from the tip side, at the rear portion of the base body, and along the chip discharge grooves, where good chip discharge performance and sliding properties are required, the diamond content ratio is decreased in order to improve the chip discharge performance and sliding properties. As a result, the cutting tool can be satisfactorily used in cutting processes over the long term.

BRIEF DESCRIPTION OF DRAWINGS

FIGS. 7A, 7B, and 7C schematically illustrate the processes in the method for manufacturing a cut product.

DESCRIPTION OF EMBODIMENTS

Figure 1:
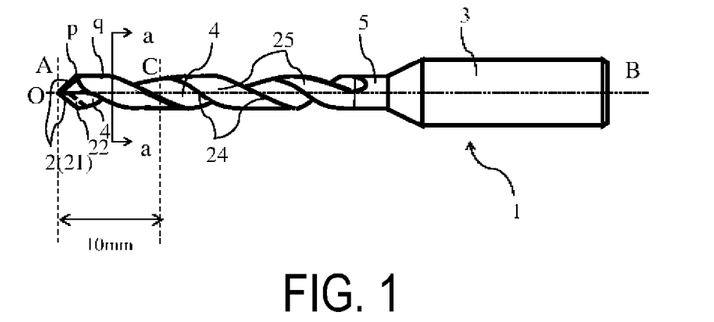
FIG. 1 is a side view of an example of a drill according to an embodiment of a cutting tool of the present invention.

Next, a cutting tool (here, a solid drill) according to Embodiment 1 of the present invention will be described with reference to the drawings. As illustrated in FIG. 1, the drill 1 is rod-shaped and has a rotation axis O. The drill 1 includes cutting edges 2 formed in a tip portion A and spiral-shaped chip discharge grooves 4 formed on the rotation direction side of the cutting edges 2 and running from the cutting edges 2 towards the rear end of the drill 1 (that is, towards a rear end B). Moreover, a shank 3 is formed on a rear end B side of the drill 1, and the shank 3 is held by a cutting device (not illustrated in the figure) when attaching the drill 1 thereto. In the present invention, the term "tip" refers to the end of the drill 1 having a rod shape (the cutting tool) that has the cutting edges 2, and the tip portion A includes the entire length of the region in which the cutting edges can be seen when viewing the drill 1 (the cutting tool) from the tip end. In the present embodiment, the tip portion A extends from the tip of the drill 1 to the point p as illustrated in FIG. 1.

In the present embodiment, a coating layer 6 composed of a mixed-phase of diamond and graphite is formed on the surface of a base body 5 of the drill 1. Moreover, as illustrated in FIG. 1, the coating layer 6 is formed extending from the tip portion A of the drill 1 to near the ends of the chip discharge grooves 4, and the remaining rearward portion of the base body 5 is left uncoated.

Furthermore, in the present embodiment, the coating layer 6 contains more diamond in the tip portion A than in a rear portion C located 10 mm rearward of the tip. As a result, the diamond content ratio at the cutting edges 2 located in the tip portion A of the base body 5 is high, thereby increasing the hardness of the coating layer 6 and making it possible to reduce wear on the coating layer 6 formed on the cutting edges 2. Moreover, the graphite content ratio rearward of the tip portion A of the base body 5 is high, thereby making the surface of the coating layer 6 very smooth. As a result, the chip discharge grooves 4 are also very smooth, thereby improving chip discharge performance. Furthermore, in the present embodiment, the diamond content ratio decreases as moving rearwards from the tip portion A (that is, towards the rear end B). In the present invention, "rear portion C" refers to the region centered on a point 10 mm rearward of the tip, and the size of this region is determined according to the spot diameter as obtained by any of a variety of analyses.

A polishing process such as a brushing treatment or a blasting treatment may be applied to the tip portion side of the drill 1 in order to smooth the surface of the coating layer 6. In this case as well, the surfaces of the chip discharge grooves 4 are difficult to polish, and the surface of the coating layer 6 is difficult to smooth.

In the present embodiment, the average grain size of the diamond on the rear portion C is smaller than the average grain size of the diamond on the tip portion A. As a result, the surface of the rear side portion of the coating layer 6 is smoother, thereby improving the chip discharge performance of the chip discharge grooves 4. Note that the average grain size of the diamond in the coating layer 6 can be calculated by observing the crystal system in the surface of the coating layer 6 with a scanning electron microscope and then using a Luzex image analysis method. Furthermore, in the present embodiment, the average grain size of the diamond decreases as moving rearwards from the tip portion A.

Figure 2:
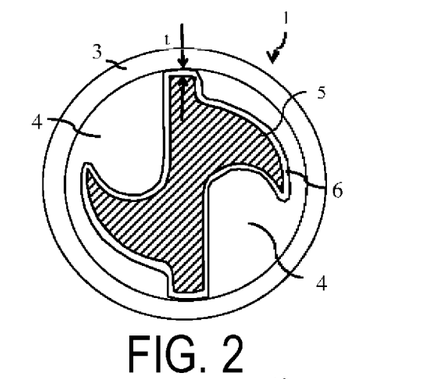
FIG. 2 is a cross-sectional view taken along line a-a in FIG. 1.

In the present embodiment, the thickness of the coating layer 6 on the rear portion C is less than the thickness of the coating layer 6 on the tip portion A. As a result, the coating layer 6 is thick at the cutting edges 2, thereby increasing the wear resistance of the coating layer 6 at the cutting edges 2. Meanwhile, the film formation speed is slower in the chip discharge grooves 4 that run rearward from the tip portion A, and the coating layer 6 gets formed more finely and smoothly in these regions. This prevents deterioration of the state of the surface of the coating layer 6. Moreover, unless explicitly mentioned otherwise, in the present embodiment the "thickness" of the coating layer 6 refers to the thickness t measured further outwards than the chip discharge grooves 4 on the outer peripheral surface of the drill 1 as illustrated in FIG. 2. When the cutting tool takes a form other than a drill, the thickness of the coating layer on the tip portion A and the thickness of the coating layer on the rear side of the cutting tool may be compared using a cross section taken orthogonally to the lengthwise direction of the cutting tool. Furthermore, in the present embodiment, the thickness of the coating layer 6 decreases as moving rearwards from the tip portion A.

In the present embodiment, the thickness of the coating layer 6 on the rear portion C is less than the thickness of the coating layer 6 on the tip portion A (not illustrated in the figures). This makes it possible to reduce wear on the coating layer 6 at the cutting edges 2 and also makes it easier to maintain the smoothness of the coating layer 6 on the chip discharge grooves 4. Here, it is preferable that the ratio $(t_B/t_A)$ of the film thickness $t_B$ of the coating layer 6 on the rear portion located 10 mm rearward of the tip to the film thickness $t_A$ (not illustrated in the figures) of the coating layer 6 on the tip portion A be from 0.2 to 0.8, and it is particularly preferable that this ratio be from 0.4 to 0.8. Moreover, it is preferable that the film thickness $t_A$ be from 5 to 12 μm.

The diamond and graphite content ratios of the coating layer 6 can be measured using a Raman spectroscopy analysis. More specifically, this ratio can be obtained by measuring the intensity of the diamond peak SP3 near 1333 $cm^{-1}$ and the intensity of the graphite peak SP2 near 1400 to 1600 $cm^{-1}$. These peak intensities should be measured with the laser beam used for the Raman spectroscopy analysis being incident orthogonal to the surface of the coating layer 6 and set to a spot diameter of 1 to 100 μm. To account for local variation in the peak intensities, if a spot diameter less than or equal to 10 μm is used, the peak intensities should be measured in at least three locations and then averaged.

Moreover, an additional coating layer (not illustrated in the figures) may be layered between the base body 5 and the coating layer 6 that is made from the mixed crystal diamond-graphite material.

Examples of materials suitable for use as the base body 5 include cemented carbide alloys and cermets made from a hard phase composed primarily of tungsten carbide or titanium carbonitride and a bonding phase composed primarily of an iron group metal such as cobalt or nickel, as well as other hard materials such as ceramics composed primarily of silicon nitride or aluminum oxide. Among these, a cemented carbide alloy with excellent damage resistance is most suitable.

It should be noted that the cutting tool of the present invention is not limited to the drill in the embodiment described above. The cutting tool may also be an end mill in which the main body of the tool is rod-shaped, end cutting edges are formed in the tip, and peripheral cutting edges are formed on the tip side of the periphery and in which chip discharge grooves 4 run adjacent to the end cutting edges and peripheral cutting edges from the tip portion rearwards. In addition, the present invention may also be suitably applied to indexable cutting edge-type drills and end mills in which the cutting edges are formed as a separate member and then attached to a prescribed position on the tip portion of a holder. Furthermore, the cutting tool may also be a boring tool in which a cutting edge is formed running from the tip portion of a main body having a rod shape to the tip portion side of a side face and a rake face that functions as a chip discharge section is formed adjacent to the cutting edge. When the cutting tool is a boring tool, the chip discharge section does not necessarily need to be spiral-shaped chip discharge grooves and may instead be a curved breaker surface formed extending from the tip portion A to a rearward portion.

Next, a cutting tool (here, a solid drill) according to Embodiment 2 of the present invention will be described. Descriptions of aspects of the configuration of Embodiment 2 that are the same as Embodiment 1 will be omitted here. Like in Embodiment 1 and as illustrated in FIG. 1, a drill 10 is rod-shaped and has a central rotation axis O. The drill 10 includes cutting edges 2, chip discharge grooves 4, and a shank 3.

In the drill 10, the cutting speed of a center portion 12 as viewed from a tip portion A side of the cutting edges 2 (hereinafter, simply "center portion 12") is zero or is lower than that of peripheral portions 13 as viewed from the tip portion A side of the cutting edges 2 (hereinafter, simply "peripheral portions 13"), and therefore the center portion 12 tends to experience abrasive wear. As a result, the cutting resistance tends to be higher at the center portion 12 of the cutting edges 2, which can cause breakage of the drill 10. Meanwhile, the cutting speed of the peripheral portions 13 of the cutting edges 2 is higher than that of the center portion 12 of the cutting edges 2, and therefore the peripheral portions 13 of the cutting edges 2 tend to be more prone to wear.

In the present embodiment, when the surface of the coating layer 6 is analyzed using Raman spectroscopy and the peak intensity ratio of the SP3 peak relative to all peaks originating from diamond is obtained, the SP3 peak intensity ratio at the center portion 12 which includes the central rotation axis O of the tip portion A and the nearby areas is lower than the SP3 peak intensity ratio at the peripheral portions 13. This makes it possible to enhance the sliding properties of the coating layer 6 at the center portion 12 and also makes it possible to reduce the grain size of the phases constituting the coating layer 6 in this area and thereby make the surface of the coating layer 6 more flat. In addition, the SP3 peak intensity ratio and the hardness of the coating layer 6 are both low at the center portion 12, and therefore the surface of the coating layer 6 at the center portion 12 becomes even flatter immediately after the initial cuts are made. This reduces cutting resistance at the center portion 12 of the cutting edges 2, thereby making it possible to prevent breakage of the drill 10. In other words, the SP3 peak intensity ratio increases as the μm-order diamond content ratio increases. Therefore, the μm-order diamond content ratio at the center portion 12 is low, and the nanodiamond and graphite content ratios are higher (note that the presence of nanodiamond and graphite reduces the SP3 peak intensity ratio).

Figure 3A:
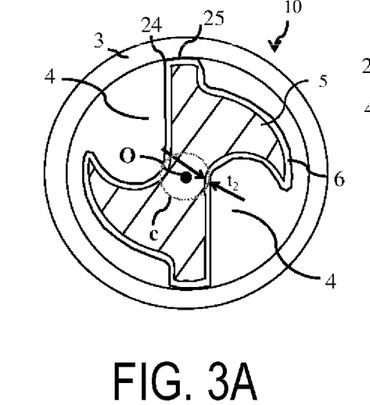
FIGS. 3A and 3B are cross-sectional views taken along line a-a of another example of a drill according to the embodiment of the cutting tool of the present invention.
Figure 3B:
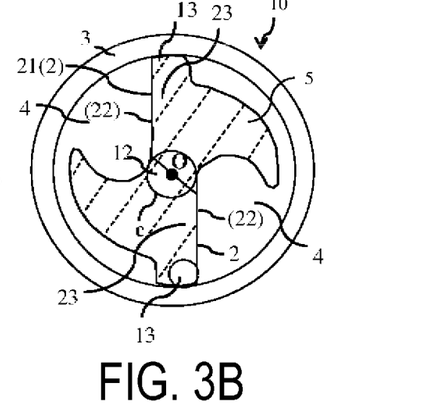

Meanwhile, the SP3 peak intensity ratio is high at the peripheral portions 13 of the cutting edges 2, and therefore the coating layer 6 exhibits high wear resistance. As a result, the cutting tool can be satisfactorily used in cutting processes over the long term. Note that in the present invention, "center portion 12" refers to the region inside the web thickness represented by the circle c in FIG. 3B, which shows the drill illustrated in FIG. 1 as viewed from the tip thereof. When measuring the center portion 12, the measured region should include the central rotation axis O. Moreover, "peripheral portions 13" refers to the regions outside of the circle c. As illustrated in FIG. 3B, when measuring these peripheral portions 13, the dashed line regions nearest to the outermost positions on the cutting edges 2 as viewed from the tip portion A side should be measured.

When measuring the SP3 peak intensity ratio using Raman spectroscopy, the intensity of the SP3 peak near 1333 cm$^{-1}$ originating from µm-order diamond, the intensity of the nanodiamond peak near 1145 cm$^{-1}$ originating from nm-order diamond, and the intensity of the SP2 peak near 1400 to 1600 cm$^{-1}$ originating from graphite created due to breakdown of the crystal structure of the diamond are measured. Note that peak intensities should be measured as the highest value of each peak. The SP3 peak intensity ratio is the ratio of the intensity of the SP3 peak to the sum total of the intensities of all three peaks. Moreover, it is preferable that the grain size of the µm-order diamond be from 0.5 to 20 µm, and it is preferable that the average grain size of the µm-order diamond be from 0.8 to 3 µm. Furthermore, it is preferable that the grain size of the nanodiamond be from 1 to 200 nm, and it is preferable that the average grain size of the nanodiamond be from 10 to 100 nm.

There are two primary configurations in which the SP3 peak intensity ratio at the center portion 12 can be lower than the SP3 peak intensity ratio at the peripheral portions 13. In the first configuration, the peak intensity ratio of the nanodiamond peak originating from nanodiamond at the center portion 12 is higher than the peak intensity ratio of the nanodiamond peak at the peripheral portions 13. In other words, in this configuration the average grain size of the diamond at the center portion 12 is less than the average grain size of the diamond at the peripheral portions 13.

Nanodiamond exhibits better sliding properties than µm-order diamond, thereby making it possible to reduce the cutting resistance of the coating layer 6 at the center portion 12 of the cutting edges 2. Moreover, diamond tends to grow in polygonal shapes as grain growth proceeds. When the average grain size of the diamond is low, the amount of diamond protruding out from the surface of the coating layer 6 is low, the surface roughness of the coating layer 6 is small, and the surface of the coating layer 6 is smooth. This makes it possible to further reduce the cutting resistance of the coating layer 6 at the center portion 12 of the cutting edges 2. Diamond also tends to become harder as grain growth proceeds, and therefore when the average grain size of the diamond is low, the hardness of the coating layer 6 decreases, and the surface of the coating layer 6 tends to become even smoother immediately after the initial cuts are made. This also makes it possible to further reduce the cutting resistance of the coating layer 6 at the center portion 12 of the cutting edges 2. Meanwhile, on the peripheral portions 13, the average grain size of the diamond is larger, and therefore the diamond is harder, and both the hardness and wear resistance of the coating layer 6 are improved. Note that the average grain size of the diamond in the coating layer 6 can be calculated by observing the crystal system in the surface or a cross section of the coating layer 6 with a scanning electron microscope or a transmission electron microscope and then using a Luzex image analysis method.

In the second configuration in which the SP3 peak intensity ratio at the center portion 12 is made to be lower than the SP3 peak intensity ratio at the peripheral portions 13, the peak intensity ratio of the SP2 peak originating from graphite at the center portion 12 is larger than the peak intensity ratio of the SP2 peak at the peripheral portions 13. In other words, the SP2 peak is the peak originating from graphite created due to breakdown of the crystal structure of diamond. Therefore, in this configuration, the graphite content ratio at the center portion 12 is greater than the graphite content ratio at the peripheral portions 13.

Graphite exhibits better sliding properties than diamond, thereby making it possible to reduce the cutting resistance of the coating layer 6 at the center portion 12 of the cutting edges 2. Moreover, graphite does not exhibit grain growth, and therefore when the graphite content ratio increases, the surface roughness of the coating layer 6 decreases and the surface of the coating layer 6 becomes smoother. This makes it possible to further reduce the cutting resistance of the coating layer 6 at the center portion 12 of the cutting edges 2. Graphite is also softer than diamond, and therefore increasing the graphite content ratio decreases the hardness of the coating layer 6 at the center portion 12 and makes the surface of the coating layer 6 become even smoother immediately after the initial cuts are made. This also makes it possible to further reduce the cutting resistance of the coating layer 6 at the center portion 12 of the cutting edges 2. Meanwhile, at the peripheral portions 13, the µm-order diamond content ratio of the coating layer 6 is higher, and therefore both the hardness and wear resistance of the coating layer 6 are improved.

The coating layer 6 may be a single-layer film or a multilayer film that includes at least two layers that exhibit different SP3 peak intensity ratios. In this case, the SP3 peak intensity ratio of the surface of the coating layer 6 at the center portion 12 should still be lower than the SP3 peak intensity ratio at the peripheral portions 13. One example of a method for achieving this is to make the nanodiamond peak intensity ratio at the center portion 12 greater than the nanodiamond peak intensity ratio at the peripheral portions 13, for example. More specifically, a first layer that contains nanodiamond is formed over the entire tip portion A of the drill 10 that includes the center portion 12 and the peripheral portions 13, and a second layer that contains µm-order diamond is formed everywhere except for on the center portion 12. Alternatively, a first layer that contains µm-order diamond may be formed over the entire tip portion A of the drill 10 that includes the center portion 12 and the peripheral portions 13, a second layer that contains nanodiamond may be formed only on the center portion 12 and not on the peripheral portions 13. In this configuration, the surface of the coating layer 6 is constituted by the nanodiamond-containing first layer at the center portion 12 and is constituted by the second layer that contains the µm-order diamond of the coating layer 6 at the peripheral portions 13. Therefore, the SP3 peak intensity ratio at the center portion 12 is less than the SP3 peak intensity ratio at the peripheral portions 13.

Next, a cutting tool (here, a solid drill) according to Embodiment 3 of the present invention will be described. Descriptions of aspects of the configuration of Embodiment 3 that are the same as Embodiment 1 or Embodiment 2 will be omitted here. Like in Embodiment 1 and as illustrated in FIG. 1, a drill 20 is rod-shaped and has a central rotation axis O. The drill 20 includes cutting edges 2, chip discharge grooves 4, and a shank 3.

A base body 5 is made from a hard alloy that contains a hard phase and a bonding phase. Examples of hard alloys include materials such as cemented carbide alloys in which the bonding phase is made from an iron group metal and the hard phase is made from tungsten carbide and cermets in which the hard phase is made from titanium carbonitride. In the present embodiment, the bonding phase content ratio is from 5 to 15 mass %, or more particularly from 6 to 8 mass %.

In the present embodiment, in the region of a tip portion A where the cutting edges 2 are formed, the bonding phase content ratio of the surface portion of the base body 5 in that region is less than 0.9 times the bonding phase content ratio of the internal portion of the base body 5 in that region, and a coating layer 6 is formed on the surface of the base body 5 in that region. In other words, the surface of the base body 5 is covered by the coating layer 6 at the cutting edges 2. In the present embodiment, the bonding phase content ratio of the surface portion of the base body 5 at the cutting edges 2 is from 0.1 to 0.3 times the bonding phase content ratio of the internal portion of the base body 5 at the cutting edges 2.

Meanwhile, in the region where the chip discharge grooves 4 are formed, the bonding phase content ratio of the surface portion of the base body 5 in that region is from 0.9 to 1.1 times the bonding phase content ratio of the internal portion of the base body 5 in that region, and the surface of the base body 5 in that region is either exposed to the external environment or has the coating layer 6 formed thereon. In other words, along the chip discharge grooves 4, the surface of the base body 5 is exposed, or the surface of the base body 5 is covered by the coating layer 6. This increases the adhesion of the coating layer 6 to the surface of the base body 5 at the cutting edges 2, thereby making it possible to reduce progression of wear on the cutting edges 2. Along the chip discharge grooves 4, the coating layer 6 is not formed or exhibits poor adhesion to the base body 5 and therefore quickly peels off. This makes the surfaces of the chip discharge grooves 4 smoother, thereby improving chip discharge performance.

In FIG. 3B, the positions at which rake faces 22 are formed are indicated by the reference characters in parentheses, although the rake faces 22 cannot be seen in this view. In the present invention, the "portion in which the cutting edges 2 are formed" refers to a region 100 μm in thickness from ridge lines 21 of flanks 23 (the dashed-line portions) as viewed from the tip side in FIG. 3B and to a region 100 μm in width that includes the ridge lines 21 formed in the tip portion of the base body 5 and extends from the ridge lines 21 towards the rake face 22 sides (that is, 100 μm rearward from the ridge lines 21 in the tip) as viewed from the side face illustrated in FIG. 1. In the side face illustrated in FIG. 1, the cutting edges 2 are formed in the tip portion side of the triangular section of the tip portion side of the drill 20, and the rake faces 22 are formed rearward thereof. The "portion in which the chip discharge grooves 4 are formed" refers to the recess-shaped grooves located rearward of the ends of the rake faces 22. In other words, the chip discharge grooves 4 that are connected to the rake faces 22, the side ridge line portions 24 that are connected to the ridge lines 21 in the cutting edges 2, and lands 25 that are connected to the flanks 23 are formed rearward of the cutting edges 2 in the base body 5. Moreover, in the present invention, the "internal portion of the base body 5" refers to the positions at a depth of at least 5 μm from the surface of the base body 5 on the rotation axis O side and to the region that includes the rotation axis O where possible. Furthermore, the "bonding phase content ratio" refers to the ratio of the amount of bonding phase contained to the total amount of metal contained in the hard alloy. In order to compare the bonding phase content ratio at the surface of the base body 5 to the bonding phase content ratio of the internal portion of the base body 5 for the section of the tip portion A in which the cutting edges 2 are formed, these ratios can be measured by observing the distribution of metal elements in a cross section taken orthogonal to the cutting edges 2 using an electron probe microanalyzer (EPMA).

Moreover, the coating layer 6 is formed extending from the tip portion A of the drill 20 to near the ends of the chip discharge grooves 4, and the remaining rearward portion of the base body 5 is left uncoated. Moreover, a polishing process such as a brushing treatment or a blasting treatment may be applied to the tip portion side of the drill 20 in order to smooth the surface of the coating layer 6 at the cutting edges 2. In this case, even if the coating layer 6 is formed on the surfaces of the chip discharge grooves 4, the adhesion thereto is poor, and therefore the coating layer 6 peels off and exposes the base body 5. Moreover, because the surfaces of the chip discharge grooves 4 are located in positions that are difficult to polish, the surfaces of the chip discharge grooves 4 do not get excessively polished, and the smoothness of the surface of the base body 5 along the chip discharge grooves 4 is not prone to damage. Moreover, a polishing process such as a brushing treatment or a blasting treatment may be applied to the tip portion side of the base body prior to forming the coating layer 6 thereon in order to adjust the surface roughness of the base body 5 at the cutting edges 2.

In the present embodiment, the average grain size of diamond grains in the coating layer 6 at the cutting edges 2 is from 0.4 to 3 μm. This increases the hardness of the coating layer 6 and prevents the surface of the coating layer 6 from becoming excessively rough, thereby reducing increases in the cutting resistance of the cutting edges 2 and reducing the potential for breakage of the drill 20. Furthermore, in the present embodiment, when the chip discharge grooves 4 are covered by the coating layer 6, the average grain size of the diamond in the coating layer 6 on the chip discharge grooves 4 is less than the average grain size of the diamond in the coating layer 6 at the cutting edges 2. This makes the surface of the rear side portion of the coating layer 6 smoother, thereby improving the chip discharge performance of the chip discharge grooves 4 even during the initial cuts. Note that the average grain size of the diamond in the coating layer 6 can be calculated by observing the crystal system in the surface of the coating layer 6 with a scanning electron microscope and then using a Luzex image analysis method.

Moreover, in the present embodiment, the interface roughness of the surface of the base body 5 at the cutting edges 2 is from 0.12 to 1.5 μm, and the interface roughness of the surface of the base body 5 along the chip discharge grooves 4 is from 0.01 to 0.1 μm. This makes it possible to optimize the adhesion of the coating layer 6 both at the cutting edges 2 and along the chip discharge grooves 4. The interface roughness can be measured by observing a cross section that includes the interface between the base body 5 and the coating layer 6 using an SEM, tracing out the interface between the base body 5 and the coating layer 6, and calculating the maximum height Ry of the traced interface as defined in JISB0601.

Furthermore, in the present embodiment, the diamond content ratio of the coating layer 6 relative to the graphite content ratio therein is higher in the coating layer 6 at the cutting edges 2 than in the coating layer 6 on the chip discharge grooves 4. Moreover, the coating layer 6 on the chip discharge grooves 4 is thinner than the coating layer 6 at the cutting edges 2. This optimizes the surface roughness of the coating layer 6 at the cutting edges 2 and on the chip discharge grooves 4 before cutting processes, thereby reducing application of excessive cutting resistance even during the initial cuts. Moreover, in the present embodiment the coating layer 6 does not necessarily have to be formed on the surfaces of the chip discharge grooves 4, and the surfaces of the chip discharge grooves 4 may be constituted by the exposed base body 5.

The "thickness of the coating layer 6 at the cutting edges 2" refers to the thickness of the coating layer 6 on the tip portion of the drill 20 (including the position of the rotation axis O). When the chip discharge grooves 4 are covered by the coating layer 6, the "thickness of the coating layer 6 on the chip discharge grooves 4" refers to the thickness of the coating layer 6 at the deepest portions in the chip discharge grooves 4 in a cross section taken orthogonal to the rotation axis O. "Deepest portions in the chip discharge grooves 4" refers to the positions on the surface of the base body 5 that are closest to the rotation axis O. Moreover, the "web thickness" is the diameter of the circle that is centered on the rotation axis O and traced out by these positions that are closest to the rotation axis O (that is, the circle c with the maximum diameter that can be drawn within the drill 20).

In the present embodiment, the ratio $(t_2/t_1)$ of the film thickness $t_2$ of the coating layer 6 on the chip discharge grooves 4 to the film thickness $t_1$ (not illustrated in the figure) of the coating layer 6 at the cutting edges 2 is from 0.2 to 0.8. This makes it possible to reduce wear on the coating layer 6 at the cutting edges 2 and also makes it possible to maintain the smoothness of the coating layer 6 on the chip discharge grooves 4. Moreover, the diamond and graphite content ratios of coating layer 6 can be measured using a Raman spectroscopy analysis. More specifically, this ratio can be obtained by measuring the intensity of the diamond peak SP3 near 1333 $cm^{-1}$ and the intensity of the graphite peak SP2 near 1400 to 1600 $cm^{-1}$.

It should be noted that the cutting tool of the present invention is not limited to the drill in the embodiment described above. The cutting tool may also be an end mill in which the main body of the tool is rod-shaped, end cutting edges are formed in the tip, and peripheral cutting edges are formed on the tip side of the periphery and in which chip discharge grooves run adjacent to the end cutting edges and peripheral cutting edges from the tip portion rearwards. In this case, it is preferable that in the peripheral cutting edges, regions of less than or equal to 50 μm in width on the rake face side of ridge lines form the cutting edges described above.

<Method for Manufacturing>

Next, a method for manufacturing the drill according to Embodiment 1 as described above will be described.

First, a centerless grinding process is applied to the surface of a rod-shaped base body, and then a sharpening process is applied to give the base body a drill shape. A polishing process may be applied to the cutting edge side of the base body as desired. Next, an etching process that includes an acid treatment and an alkali treatment is applied to the surface of the base body, thereby producing a drill-shaped base body.

Figure 4:
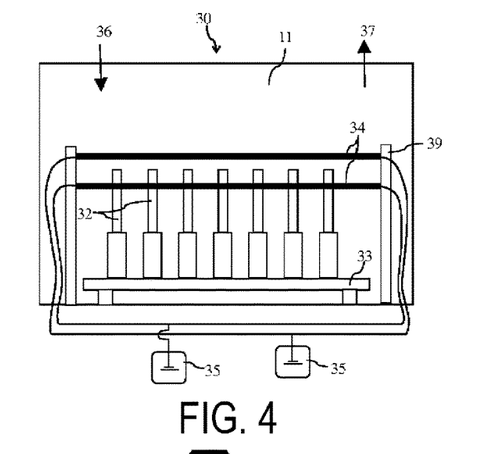
FIG. 4 schematically illustrates a process for forming a coating layer as a film on the drill illustrated in FIG. 1.

Then, a coating layer is formed as a film on the surface of the base body. A hot filament CVD process may be suitably applied as the film formation method for the coating layer. Next, the details of one example of a film formation method will be described. A film formation device 30 includes a chamber 31, and a sample platform 33 on which to set samples 32 (here, the etched base bodies) is formed inside the chamber 31. In the present embodiment, the base bodies 32 having a rod shape are set in a vertically upright orientation with the tip portions facing up. In FIG. 4, the cutting edge portions of the base bodies 32 (that is, the portions that include the cutting edges and the chip discharge grooves) are not illustrated.

Furthermore, heaters 34 such as a filaments are arranged surrounding the base bodies 32. The heaters 34 are connected to a power supply 35 arranged outside of the chamber 31. In the present embodiment, a plurality of heaters 34 are used, and the arrangement of these heaters 34 as well as the current supplied to each are adjusted such that the temperature of the base bodies 32 having a rod shape set on the sample platform 33 varies in the lengthwise direction of the base bodies 32. More specifically, the heaters 34 are adjusted such that the temperature of the base bodies 32 is highest as the tip portions thereof and such that the temperature gradually decreases towards the rear sides of the base bodies 32. Furthermore, the heaters 34 are supported by supports 39.

A source gas inlet 36 and a gas exhaust outlet 37 are formed in the chamber 31. A vacuum is drawn on the chamber 31, and then hydrogen gas and methane gas are supplied to the chamber 31 via the source gas inlet 36 and blown over the base bodies 32, thereby making it possible to obtain cutting tools in which the ratio of the mixture of diamond to graphite varies in the lengthwise direction of the base bodies 32.

Next, an example of a method for manufacturing the drill according to Embodiment 2 as described above will be described. Descriptions of aspects of the configuration of Embodiment 2 that are the same as Embodiment 1 will be omitted here. First, a drill-shaped base body is produced. In the present embodiment, as a first method of reducing the SP3 peak intensity ratio at the center portion 12, a method in which a masking agent such as a resin is applied to the center portion 12 when etching the surface of the base body after polishing and the etching process is applied to the surface of the base body can be used. This method makes it possible to control the etching process such that the bonding phase content ratio of the surface of the base body does not decrease at the center portion 12. This reduces diamond grain growth on the center portion 12 when later forming the coating layer that contains diamond and increases the graphite content ratio.

Figure 5:
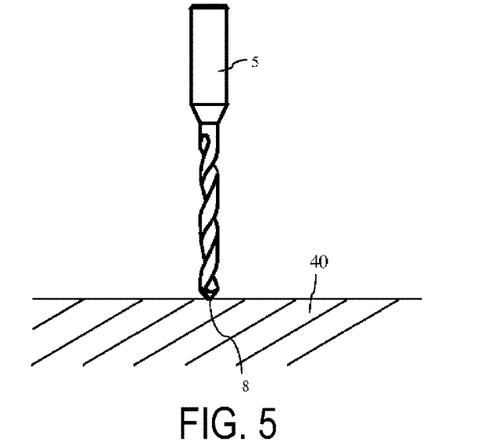
FIG. 5 schematically illustrates a process for etching the base body of a drill according to Embodiment 2.

As a second method of reducing the SP3 peak intensity ratio at the center portion 12, the base body 5 may be immersed in a cobalt-containing solution 40 after the etching process such that, as illustrated in FIG. 5, only a prescribed portion of the base body 5 (primarily the center portion 12) is immersed in order to re-impregnate just the center portion 12 with cobalt. This reduces diamond grain growth on the center portion 12 when later forming the coating layer and increases the graphite content ratio. The etched base body is then cleaned with water or the like and dried.

Next, the coating layer is formed. As a third method of reducing the SP3 peak intensity ratio at the center portion 12, after forming a first layer that contains nanodiamond over the entire tip portion A of the drill 10, the center portion 12 of the drill 10 may be masked by applying a carbon slurry or the like, and then a second layer that contains μm-order diamond may be formed. In this method, the second layer formed on the center portion 12 is removed along with the mask after the film formation process is complete. In the present embodiment, the first layer and the second layer are formed at the same temperature; however, the magnitude of the vacuum is adjusted to 0.5 to 2 kPa while forming the first layer, and the magnitude of the vacuum is adjusted to 3 to 5 kPa while forming the second layer. Furthermore, the ratio of methane used (in terms of volume percent) while forming the first layer is adjusted to be higher than the ratio of methane used while forming the second layer. This ensures that the first layer exhibits a nanodiamond peak and that the second layer does not exhibit an SP3 peak when performing the Raman spectroscopy analysis. Furthermore, this results in the average grain size of the diamond in the first layer being at least an order of magnitude less than the average grain size of the diamond in the second layer.

Figure 6:
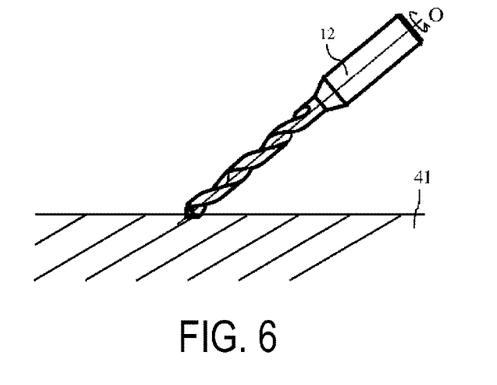
FIG. 6 schematically illustrates a process for etching the base body of a drill according to Embodiment 3.

Next, an example of a method for manufacturing the drill according to Embodiment 3 as described above will be described. Descriptions of aspects of the configuration of Embodiment 3 that are the same as Embodiment 1 or Embodiment 2 will be omitted here. First, a drill-shaped base body is produced. In the present embodiment, the base body 5 is immersed in an acid solution 41 during the acid treatment of the etching process such that, as illustrated in FIG. 6, only a prescribed portion of the base body 5 (primarily the cutting edges 2) is immersed in the acid solution 41, and the etching process is performed while rotating the base body 5 about the rotation axis in the lengthwise direction. This method makes it possible to control the bonding phase content ratio of the surface of the base body. Moreover, adjusting the concentration of the acid solution 41 and the duration of immersion makes it possible to adjust the bonding phase content ratio in the cutting edges. The etched base body is then cleaned with water or the like and dried, and then the coating layer is formed.

<Production Method for a Cut Workpiece>

Figure 7A:
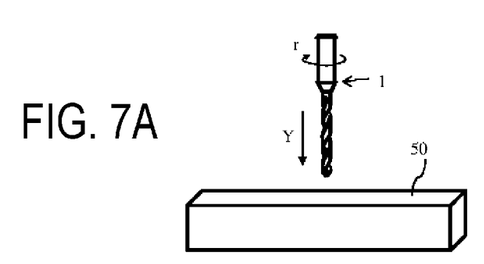
FIGS. 7A, 7B, and 7C illustrate a method for manufacturing a cut product according to an embodiment of the present invention.
Figure 7B:
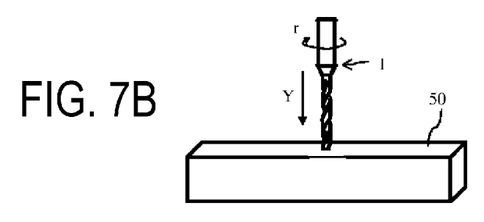
Figure 7C:
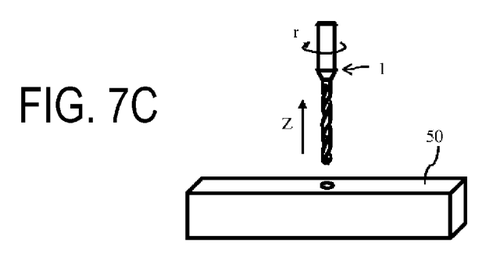

Next, an example of a method for manufacturing a cut workpiece according to the present embodiment using the drill 1 as described above will be described in detail with reference to FIG. 7. FIG. 7A illustrates a process in which the drill 1 is moved in the Y direction towards a workpiece 50. FIG. 7B illustrates a process in which the drill 1 is brought into contact with the workpiece 50. FIG. 7C illustrates a process in which the drill 1 is moved away from the workpiece 50 in the Z direction.

The method for manufacturing the cut workpiece according to the present embodiment includes the following steps (i) to (iv).

(i) Positioning the drill 1 above the prepared workpiece 50 (FIG. 7A).

(ii) Rotating the drill 1 about the rotation axis O in the rotation direction indicated by the arrow r, and moving the drill 1 in the Y direction towards the workpiece 50 (FIGS. 7A and 7B). During this step, the workpiece 50 can be fixed to the table portion of a machining tool to which the drill 1 is attached, and the rotating drill 1 can be moved towards the workpiece 50, for example. It should be noted that during this step, the workpiece 50 and the drill 1 may be moved in any manner that brings them closer to one another. For example, the drill 1 may be fixed in place, and the workpiece 50 may be moved towards the drill 1.

(iii) Continuing to move the drill 1 towards the workpiece 50 until the cutting edges 2 of the rotating drill 1 come into contact with a prescribed position on the surface of the workpiece 50, and drilling a hole (a through hole) 51 in the workpiece 50 as illustrated in FIG. 7C (FIG. 7B).

(iv) Moving the drill 1 in the Z direction in order to remove the drill 1 from the through hole 51 formed in the workpiece 50 (FIG. 7C). It should be noted that like in step (ii), during this step the workpiece 50 and the drill 1 may be moved in any manner that moves them apart from one another. For example, the drill 1 may be fixed in place, and the workpiece 50 may be moved away from the drill 1.

The steps described above make it possible for the drill 1 to exhibit excellent hole-drilling performance. Moreover, when drilling multiple holes, the step in which the cutting edges 2 of the drill 1 are brought into contact with the workpiece 50 may be repeated at different locations on the workpiece 50 with the drill 1 kept in the rotating state for the entire process.

Working Example 1

Starting with a tungsten carbide (WC) powder with an average grain size of 0.5 μm, 10 mass % of metallic cobalt (Co) powder, 0.2 mass % of titanium carbide (TiC) powder, and 0.8 mass % of chromium carbide ($Cr_3C_2$) were added. The resulting mixture was blended together, molded into a cylindrical shape, and sintered. Next, the cylinder was ground into a drill shape, and the surface was cleaned with an alkali, an acid, and distilled water (in that order) to produce a drill base body with a diameter of 6 mm, a cutting length of 10 mm, a web thickness 3 mm thick, and two cutting edges.

This base body was placed in the film formation device illustrated in FIG. 4, and a coating layer made from a mixed crystal material containing diamond and graphite was formed on the surface of the base body using a hot filament CVD process. The reaction chamber of the film formation device was 25 cm in diameter and 20 cm in height. A total of three tungsten filaments 0.4 mm in thickness were arranged in this reaction chamber: one on the tip portion side of the base body, and the other two along the side faces of the reaction chamber on either side of the base body. The drill-shaped base body was placed in a vertically upright orientation with the tip portion facing up. Moreover, the currents supplied to the tungsten filaments were adjusted such that the temperatures shown in Table 1 were achieved at the tip of the base body and at positions 5 mm, and 10 mm rearward from the tip of the base body.

Then, a vacuum was drawn on the reaction chamber, and a reactive gas with a composition of 97 v % hydrogen to 3 v % methane was supplied to the reaction chamber via an inlet in order to form the coating layer. The crystal structure of the resulting coating layer was then analyzed at the tip of the drill and at the positions 5 mm and 10 mm rearward of the tip using Raman scattering spectroscopy in order to estimate the diamond content ratio at each position from the SP3 peak intensity ratio (SP3/(SP3+SP2)) between the intensities of the diamond peak SP3 near 1333 $cm^{-1}$ and the graphite peak SP2 near 1400 to 1600 $cm^{-1}$.

Moreover, the coating layer formed on the surface of the drill was observed with an SEM, and the average grain size of the diamond was calculated using a Luzex image analysis method. In addition, cross sections of the coating layer at the tip of the drill and at the positions 5 mm and 10 mm rearward of the tip were observed using an SEM in order to measure the thickness of the coating layer at each position. The results are shown in Table 1.

Furthermore, a cutting test was performed using the drills produced as described above under the following cutting conditions in order to evaluate cutting performance. The results are shown in Table 2.

Cutting process: Drilling a hole (a through hole)
Workpiece: CFRP
Cutting speed (feed): 100 mm/minute
Feed rate: 0.075 mm/cutting edge
Through hole dimensions: 8 mm in depth, 6 mm in diameter
Coolant: dry
Evaluation method: After drilling 1500 holes, measure width of wear region on tips of cutting edges (simply "wear width" in the table), count number of holes that have burrs, and verify state of drill once it is no longer able to drill holes.

TABLE 1

| Sample No. | Base Body Temperature (° C.) | | | SP3 Ratio (%) | | | Average Grain Size (μm) | | | Thickness (μm) | | |
|---|---|---|---|---|---|---|---|---|---|---|---|---|
| | Tip | 5 mm | 10 mm | Tip | 5 mm | 10 mm | Tip | 5 mm | 10 mm | Tip | 5 mm | 10 mm |
| 1 | 860 | 700 | 550 | 90 | 70 | 50 | 0.18 | 0.09 | 0.03 | 8.2 | 5.6 | 3.4 |
| 2 | 820 | 650 | 480 | 80 | 64 | 45 | 0.22 | 0.04 | 0.009 | 7.1 | 4.9 | 2.6 |
| 3 | 900 | 760 | 650 | 92 | 75 | 55 | 0.12 | 0.06 | 0.04 | 11.9 | 8.0 | 4.2 |
| 4 | 860 | 860 | 860 | 90 | 90 | 90 | 0.20 | 0.18 | 0.16 | 12.1 | 12.1 | 12.1 |
| 5 | 700 | 700 | 700 | 70 | 70 | 70 | 0.06 | 0.06 | 0.06 | 7.9 | 7.9 | 7.9 |

TABLE 2

| | Cutting Performance | | |
|---|---|---|---|
| Sample No. | Wear Width (mm) | Number of Holes Drilled | Cutting State |
| 1 | 0.198 | 2928 | Normal wear |
| 2 | 0.212 | 2771 | Normal wear |
| 3 | 0.184 | 3240 | Normal wear |
| 4 | — | 1093 | Damaged |
| 5 | 0.422 | 1650 | Normal wear |

As shown in Tables 1 and 2, Sample No. 4 (for which the diamond content ratio at the tip of the base body and at the position 10 mm rearward of the tip was the same) exhibited poor chip discharge performance and tended to become clogged with chips, thereby placing excess load on the drill and eventually resulting in breakage. Moreover, Sample No. 5 exhibited poor wear resistance along the cutting edges and was only able to drill a small number of holes.

In contrast, Samples No. 1 to 3 (for which the diamond content ratio was higher at the tip of the base body than at the position 10 mm rearward of the tip) all exhibited good wear resistance along the cutting edges, good chip discharge performance, and were able to drill a large number of holes.

Working Example 2

Drill base bodies were produced the same as in Working Example 1. Moreover, for Samples No. II-1 to II-3, after the etching process, the drill base bodies were immersed in a cobalt chloride ($CoCl_2$) methanol solution such that only the center portions thereof were immersed, and then the base bodies were removed from the solution and cleaned with distilled water. For Sample No. II-4, a mask was applied to the center portion of the drill prior to the acid treatment, and then the acid treatment was performed. For Sample No. II-7, after the acid treatment, the drill base body was immersed in the cobalt chloride ($CoCl_2$) methanol solution such that the entire tip portion side thereof was immersed, and then the base body was removed from the solution and cleaned with distilled water. These conditions are noted in the Treatment column of Table 3.

Next, coating layers were formed on the base bodies the same as in Working Example 1. For Sample No. II-5, prior to forming the coating layer, the film-forming temperature of the tip portion was adjusted to 820° C. and the film-forming temperature of the position 3 mm rearward of the tip of the drill base body was adjusted to 650° C. A vacuum of 0.8 kPa in magnitude was drawn on the reaction chamber, and a reactive gas with a composition of 94 v % hydrogen to 6 v % methane was supplied to the reaction chamber via an inlet in order to form a nanodiamond-containing first layer. Then, a mask was applied to the center portion, and a second layer was formed for the coating layer described above.

Next, the crystal structures of the resulting coating layers were analyzed at the center and peripheral portions of the tip portion of each drill using Raman scattering spectroscopy. For the center portion, the region including the central rotation axis O was measured. For the peripheral portions 13, the regions nearest to the outermost positions on the cutting edges as viewed from the tip side (the dashed line regions in FIG. 3B) were measured. The resulting measurement data was used to estimate the diamond content ratio at each position from the SP3 peak intensity ratio (SP3/(SP3+SP2+nanodiamond (nano))) between the intensities of the diamond peak SP3 near 1333 $cm^{-1}$, the graphite peak SP2 near 1400 to 1600 $cm^{-1}$, and the nanodiamond peak near 1145 $cm^{-1}$. In Tables 4, the ratio of the SP3 peak intensity ratio at the center portion to the SP3 peak intensity ratio at the peripheral portions is listed in the Ratio of SP3 Ratios (center portion/peripheral portions) column.

Moreover, the coating layers formed on the surfaces of the drills were observed with a SEM or a TEM, and the average grain size of the diamond was calculated using a Luzex image analysis method. Furthermore, cross sections of the coating layers at the outermost positions of the peripheral portions as viewed from the tip of the drill were observed using an SEM at the tip (point p in FIG. 1) and at the position 3 mm rearward of the tip (point q in FIG. 1) in order to measure the thickness of the coating layer at each position (listed in the Tip Portion $t_A$ and 3 mm $t_B$ columns in the table). The results are shown in Table 5.

Furthermore, a cutting test was performed using the drills produced as described above under the following cutting conditions in order to evaluate cutting performance. The results are shown in Table 5.

Cutting process: Drilling a hole (a through hole) 6 mm in diameter

Workpiece: CFRP, 8 mm depth

Cutting speed (feed): 200 mm/minute

Feed rate: 0.075 mm/rev

Coolant: dry

Evaluation method: 100 drills of each sample type were evaluated, and the number of drills that suffered early breakage before 100 holes had been drilled were counted. Furthermore, with the drills that did not suffer early breakage, 1500 additional holes were drilled, and the width of the wear region on the tips of the cutting edges (simply "wear width" in the table) was measured for each drill and then averaged for each sample type. In addition, the number of holes drilled before burrs started to form and the drill was no longer able to drill holes was counted for each drill and then averaged for each sample type (the Number of Holes Drilled column in the table).

TABLE 3

| Sample No. | Treatment | Base Body Temperature (° C.) | | | | Raman Spectroscopy (at center portion of tip) | | | |
|---|---|---|---|---|---|---|---|---|---|
| | | Tip | 3 mm | 5 mm | 10 mm | SP3 | SP2 | nano | SP3 Ratio (%) |
| II-1 | Only center portion of tip immersed in CoCl$_2$ | 860 | 700 | 700 | 650 | 8060 | 9300 | — | 46 |
| II-2 | Only center portion of tip immersed in CoCl$_2$ | 820 | 650 | 640 | 580 | 7192 | 8432 | — | 46 |
| II-3 | Only center portion of tip immersed in CoCl$_2$ | 900 | 760 | 760 | 650 | 9176 | 10044 | — | 48 |
| II-4 | Mask applied to center portion of tip before acid treatment | 860 | 700 | 860 | 850 | 8040 | 6572 | — | 55 |
| II-5 | Formed nanodiamond layer as first layer, applied mask to center portion of tip, and then formed diamond layer as second layer | 860 | 700 | 690 | 680 | 3920 | 5456 | 5780 | 42 |
| II-6 | — | 860 | 700 | 860 | 860 | 10160 | 5700 | — | 64 |
| II-7 | Immersed entire base body in CoCl$_2$ | 860 | 700 | 860 | 860 | 8160 | 6820 | — | 54 |
| II-8 | Only center portion of tip immersed in CoCl$_2$ | 900 | 760 | 700 | 650 | 9200 | 10098 | — | 48 |
| II-9 | — | 860 | 700 | 700 | 650 | 10150 | 5700 | — | 64 |
| II-10 | Immersed entire base body in CoCl$_2$ | 860 | 700 | 680 | 650 | 8160 | 6820 | — | 54 |

TABLE 4

| Sample No. | Raman Spectroscopy (at peripheral portions of tip) | | | SP3 Ratio (%) | Ratios (center portion/peripheral portions) | SP3 Ratio (%) | | Average Grain Size (μm) | | | |
|---|---|---|---|---|---|---|---|---|---|---|---|
| | SP3 | SP2 | nano | | | 5 mm | 10 mm | Center portion | Peripheral portion | 5 mm | 10 mm |
| II-1 | 11160 | 6696 | — | 63 | 0.74 | 60 | 55 | 0.90 | 0.95 | 0.84 | 0.51 |
| II-2 | 9920 | 7440 | — | 57 | 0.81 | 55 | 52 | 0.85 | 0.89 | 0.7 | 0.52 |
| II-3 | 11408 | 5580 | — | 67 | 0.71 | 65 | 63 | 1.05 | 1.06 | 0.82 | 0.75 |
| II-4 | 11160 | 6720 | — | 62 | 0.88 | 60 | 58 | 0.90 | 0.95 | 0.75 | 0.70 |
| II-5 | 10540 | 5952 | — | 64 | 0.65 | 63 | 62 | 0.09 | 0.93 | 0.61 | 0.54 |
| II-6 | 11160 | 6280 | — | 64 | 1.00 | 64 | 64 | 0.09 | 0.18 | 0.18 | 0.16 |
| II-7 | 8160 | 6820 | — | 54 | 1.00 | 54 | 54 | 0.09 | 0.18 | 0.2 | 0.18 |
| II-8 | 11900 | 5670 | — | 68 | 0.70 | 65 | 63 | 1.05 | 1.06 | 0.82 | 0.75 |
| II-9 | 11160 | 6280 | — | 64 | 1.00 | 62 | 60 | 0.09 | 0.60 | 0.18 | 0.16 |
| II-10 | 8160 | 6820 | — | 54 | 1.00 | 52 | 51 | 0.09 | 0.51 | 0.2 | 0.18 |

TABLE 5

| Sample No. | Thickness (μm) | | | | | Cutting Performance | | |
|---|---|---|---|---|---|---|---|---|
| | Tip $t_A$ | 3 mm $t_B$ | $t_B/t_A$ | 5 mm | 10 mm | Wear Width (mm) | Number of Drills Broken within First 100 Holes | Number of Holes Drilled |
| II-1 | 8.2 | 5.6 | 0.68 | 6.0 | 5.4 | 0.198 | 0/100 | 2928 |
| II-2 | 7.1 | 4.0 | 0.56 | 5.5 | 4.9 | 0.212 | 0/100 | 2771 |
| II-3 | 11.9 | 7.0 | 0.59 | 7.1 | 6.2 | 0.184 | 0/100 | 3240 |
| II-4 | 7.2 | 5.6 | 0.78 | 5.4 | 4.9 | 0.185 | 0/100 | 1940 |
| II-5 | 10.2 | 6.6 | 0.65 | 6.6 | 5.8 | 0.180 | 0/100 | 3040 |
| II-6 | 8.2 | 5.6 | 0.68 | 8.2 | 8.2 | 0.204 | 5/100 | 414 |

TABLE 5-continued

| | Thickness (μm) | | | | | Cutting Performance | | |
| --- | --- | --- | --- | --- | --- | --- | --- | --- |
| | | | | | | Wear | Number of Drills | |
| Sample No. | Tip $t_A$ | 3 mm $t_B$ | $t_B/t_A$ | 5 mm | 10 mm | Width (mm) | Broken within First 100 Holes | Number of Holes Drilled |
| II-7 | 8.2 | 5.6 | 0.68 | 8.2 | 8.2 | 0.384 | 0/100 | 854 |
| II-8 | 14.5 | 11.2 | 0.77 | 9.4 | 8.7 | 0.171 | 0/100 | 3920 |
| II-9 | 8.2 | 5.6 | 0.68 | 6.0 | 5.4 | 0.200 | 5/100 | 1420 |
| II-10 | 8.2 | 5.6 | 0.68 | 6.0 | 5.4 | 0.266 | 0/100 | 1650 |

As shown in Tables 3 to 5, for Samples No. II-6 and II-9 (for which the center portions were not immersed in the $CoCl_2$ solution nor was a mask applied to the center portions before the etching process, and therefore the SP3 peak intensity ratio at the center portions was equal to the SP3 peak intensity ratio at the peripheral portions), the cutting resistance at the center portion of the tip portion was high, the number of drills that suffered breakage was large, and the number of holes drilled was small. Moreover, Samples No. II-7 and II-10 (for which the entire base body was immersed in the $CoCl_2$ solution during the etching process) exhibited excessive wear at the peripheral portions.

In contrast, Samples No. II-1 to II-5 and II-8 (for which the SP3 peak intensity ratio at the center portion was lower than the SP3 peak intensity ratio at the peripheral portion) all exhibited no breakage and good wear resistance at the peripheral portions and were able to drill a large number of holes.

Working Example 3

Starting with a tungsten carbide (WC) powder with an average grain size of 0.5 μm, 7.0 mass % of a metallic cobalt (Co) powder and 0.8 mass % of a chromium carbide ($Cr_3C_2$) powder were added, and drill base bodies were produced using the same method as in Working Example 1.

Next, as illustrated in FIG. 6, the drill base bodies were etched by immersing the base bodies to a depth of 0.5 mm in an acid solution (for 15 minutes in hydrochloric acid of the concentrations shown in Table 6) and then in an alkaline solution (5 to 30 seconds in Murakami's reagent) while rotating the base bodies about the respective rotation axes at an angle of 30° relative to the surfaces of the acid solution and the alkaline solution. Then, the surfaces were cleaned with distilled water to finish the drill base bodies. For Sample No. III-5, the rotation axis of the base body was oriented orthogonal to the surfaces of the acid solution and the alkaline solution, and the base body was immersed to a depth of 1 mm. For Sample No. III-7, the rotation axis of the base body was oriented orthogonal to the surfaces of the acid solution and the alkaline solution, and the base body was immersed to a depth of 10 mm. For Sample No. III-6, the etching process was not performed. Next, coating layers were formed on the base bodies the same as in Working Example 1.

The crystal structures of the resulting coating layers were then analyzed at the tip of the drill and at positions 5 mm and 10 mm rearward of the tip using Raman scattering spectroscopy in order to estimate the diamond content ratio at each position from the SP3 peak intensity ratio (SP3/(SP3+SP2)) between the intensities of the diamond peak SP3 near 1333 $cm^{-1}$ and the graphite peak SP2 near 1400 to 1600 $cm^{-1}$. Moreover, the coating layer formed on the surface of the drill was observed with an SEM, and the average grain size of the diamond was calculated using a Luzex image analysis method. In addition, cross sections of the coating layers on the cutting edges at the tip of the drill and on the chip discharge grooves at a position 3 mm rearward of the tip were observed using an SEM in order to measure the thickness of the coating layer at each position. In the tables, the thickness at the cutting edges is listed as $t_1$ and the thickness on the chip discharge grooves is listed as $t_2$. Moreover, the interface roughness at each position was obtained from these SEM images by tracing out the interfaces between the base bodies and the coating layers and then calculating the maximum height Ry of the traced interfaces as defined in JISB0601. Furthermore, an EPMA analysis was performed in order to measure the ratio of bonding phase (Co) contained relative to the total amount of metal in the cemented carbide alloy at the surface of the base body at the cutting edges of the drill tip (the "Cutting edge e" column in the table), at the surface of the base body at the chip discharge grooves (that is, at the position 3 mm rearward from the tip of the drill) (the "Chip discharge grooves g" column in the table), and in the center portion of the 3 mm rearward position (the "Internal portion i" column in the table). The results are shown in Tables 6 to 8.

Furthermore, a cutting test was performed using the drills produced as described above under the following cutting conditions in order to evaluate cutting performance. The results are shown in Table 8.

Cutting process: Drilling a hole (a through hole)

Workpiece: CFRP

Cutting speed (feed): 120 mm/minute

Feed rate: 0.075 mm/cutting edge

Through hole dimensions: 8 mm in depth, 6 mm in diameter

Coolant: dry

Evaluation method: After drilling 1000 holes (or after the last hole drilled for samples that become unable to drill any more holes before 1000 holes), measure width of wear region on tips of cutting edges (simply "wear width" in the table), count number of holes that have burrs, and verify state of each drill once it is no longer able to drill holes.

TABLE 6

| Sample No. | Acid Treatment Method | Acid Treatment Concentration (%) | Base Body Temperature (° C.) Cutting edges | Base Body Temperature (° C.) Chip discharge grooves | Base Body Temperature (° C.) 5 mm | Base Body Temperature (° C.) 10 mm | Binder Phase (mass %) Internal portion i | Binder Phase (mass %) Surface Cutting edges e | Binder Phase (mass %) Surface Chip discharge grooves g | e/i | g/i |
|---|---|---|---|---|---|---|---|---|---|---|---|
| III-1 | Angled | 3% | 860 | 700 | 700 | 550 | 7.0 | 2.0 | 6.9 | 0.29 | 0.99 |
| III-2 | Angled | 10% | 820 | 650 | 650 | 580 | 7.0 | 1.0 | 6.7 | 0.14 | 0.96 |
| III-3 | Angled | 6% | 900 | 760 | 760 | 650 | 7.0 | 1.6 | 6.8 | 0.23 | 0.97 |
| III-4 | Angled | 12% | 860 | 700 | 860 | 800 | 7.0 | 0.8 | 6.6 | 0.11 | 0.94 |
| III-5 | Tip | 10% | 860 | 700 | 700 | 550 | 7.0 | 0.9 | 6.3 | 0.13 | 0.90 |
| III-6 | — | — | 860 | 860 | 860 | 860 | 7.0 | 7.0 | 7.0 | 1.00 | 1.00 |
| III-7 | Entire base body | 8% | 860 | 860 | 860 | 860 | 7.0 | 0.5 | 1.0 | 0.07 | 0.14 |
| III-8 | Angled | 6% | 900 | 760 | 850 | 800 | 7.0 | 1.6 | 6.8 | 0.23 | 0.97 |
| III-9 | — | — | 860 | 700 | 700 | 550 | 7.0 | 7.0 | 7.0 | 1.00 | 1.00 |
| III-10 | Entire base body | 8% | 860 | 700 | 700 | 550 | 7.0 | 0.5 | 1.0 | 0.07 | 0.14 |

TABLE 7

| Sample No. | Interface Roughness (μm) Cutting edges | Interface Roughness (μm) Chip discharge grooves | Diamond Content Ratio (SP3 Ratio (%)) Cutting edges | Diamond Content Ratio (SP3 Ratio (%)) Chip discharge grooves | Diamond Content Ratio (SP3 Ratio (%)) Cutting edges/chip discharge grooves ratio | Diamond Content Ratio (SP3 Ratio (%)) 5 mm | Diamond Content Ratio (SP3 Ratio (%)) 10 mm | Average Grain Size (μm) Cutting edges | Average Grain Size (μm) Chip removal grooves |
|---|---|---|---|---|---|---|---|---|---|
| III-1 | 0.20 | 0.06 | 90 | 70 | 0.78 | 82 | 75 | 1.14 | 0.68 |
| III-2 | 0.94 | 0.07 | 80 | 64 | 0.80 | 75 | 70 | 0.46 | 0.30 |
| III-3 | 0.31 | 0.04 | 92 | 75 | 0.82 | 85 | 79 | 2.36 | 1.40 |
| III-4 | 1.41 | 0.65 | 90 | 70 | 0.78 | 85 | 75 | 1.83 | 1.10 |
| III-5 | 1.12 | 1.24 | 85 | 70 | 0.82 | 78 | 70 | 1.54 | 0.92 |
| III-6 | 0.06 | 0.05 | 50 | 40 | 0.80 | 42 | 40 | 0.34 | 0.29 |
| III-7 | 1.31 | 4.95 | 90 | 70 | 0.78 | 82 | 75 | 1.54 | 1.00 |
| III-8 | 0.31 | 0.04 | 92 | 75 | 0.82 | 85 | 79 | 2.36 | 1.40 |
| III-9 | 0.06 | 0.05 | 50 | 40 | 0.80 | 42 | 40 | 0.34 | 0.29 |
| III-10 | 1.31 | 4.95 | 90 | 70 | 0.78 | 82 | 75 | 1.54 | 1.00 |

TABLE 8

| Sample No. | Thickness (μm) Cutting edges $t_1$ | Thickness (μm) Chip discharge grooves $t_2$ | $t_1/t_2$ | 5 mm | 10 mm | Cutting Performance Wear Width (mm) | Cutting Performance Number of Holes Drilled | Cutting State |
|---|---|---|---|---|---|---|---|---|
| III-1 | 8.0 | 5.5 | 1.5 | 5.3 | 4.7 | 0.188 | 2050 | Normal wear |
| III-2 | 7.1 | 4.9 | 1.4 | 4.9 | 4.6 | 0.220 | 1940 | Normal wear |
| III-3 | 11.6 | 8.0 | 1.5 | 10.8 | 9.6 | 0.165 | 2270 | Normal wear |
| III-4 | 8.2 | 5.6 | 1.5 | 5.4 | 4.8 | 0.172 | 1360 | Normal wear |
| III-5 | 8.2 | 5.6 | 1.5 | 5.4 | 4.8 | 0.208 | 2130 | Normal wear |
| III-6 | 4.2 | 2.6 | 1.6 | 4.2 | 4.2 | 0.244 | 414 | Film separation |
| III-7 | 8.3 | 5.7 | 1.5 | 8.3 | 8.3 | 0.284 | 854 | Clogged with chips |
| III-8 | 18.4 | 12.8 | 1.4 | 15.6 | 13.1 | 0.153 | 2500 | Normal wear |
| III-9 | 4.2 | 2.6 | 1.6 | 3.8 | 3.6 | 0.218 | 1130 | Chipping evident |
| III-10 | 8.3 | 5.7 | 1.5 | 5.5 | 4.5 | 0.222 | 1590 | Tended to get clogged with chips |

As shown in Tables 6 to 8, in Sample No. III-6 (for which the base body was not etched and the bonding phase content ratio of the surface portion of the base body at the cutting edges was equal to or greater than 0.9 times the bonding phase content ratio of the internal portion of the base body), the coating layer separated from the cutting edges at an early stage, the cutting edges exhibited poor wear resistance, and the drill was only able to drill a small number of holes. Moreover, in Sample No. III-7 (for which both the cutting edges and the chip discharge grooves were immersed in the acid solution during the etching process, and the bonding phase content ratio of the surface portion of the base body along the chip discharge grooves was less than 0.9 times the bonding phase content ratio of the internal portion of the base body), the surfaces of the chip discharge grooves were rough, the chip discharge performance was poor, and the drill tended to become clogged with chips, thereby putting an excessive load on the drill and eventually causing breakage.

In contrast, in Samples No. III-1 to III-5 and III-8 (for which the ratio e/i between the ratios of bonding phase contained at the cutting edges was less than 0.9 and the ratio g/i between the ratios of bonding phase contained along the chip discharge grooves was from 0.9 to 1.1) all exhibited good wear resistance along the cutting edges and good chip discharge performance and were able to drill a large number of holes. Moreover, in Sample No. III-5, the coating layer partially separated from the surfaces of the chip discharge grooves, leaving the base body exposed.

REFERENCE SIGNS LIST 1, 10, 20 Drill
2 Cutting edge
3 Shank
4 Chip discharge groove
5 Base body
6 Coating layer
12 Center portion
13 Peripheral portion
21 Ridge line
22 Rake face
23 Flank
24 Side ridge line portion
25 Land
A Tip portion
B Rear end
O Central rotation axis

The invention claimed is:
1. A cutting tool with a rod shape and cutting edge, comprising:
   a base body elongated in a direction with the cutting edge at an end, having a central rotation axis along the direction, rotatable along the central rotation axis, and comprising a tip portion at the cutting edge, the tip portion comprising:
      a center portion including the central rotation axis in a tip side view; and
      a peripheral portion outside of the center portion, including an outermost part of the tip portion in the tip side view; and
   a coating layer disposed on the base body at the tip portion, and containing diamond,
   wherein a first ratio is less than a second ratio, where the first ratio is a ratio of an SP3 peak intensity of a surface of the coating layer at the center portion to a total of SP2 and SP3 peak intensities in a Raman spectroscopy analysis, and the second ratio is a ratio of the SP3 peak intensity of the surface at the peripheral portion to the total.
2. The cutting tool according to claim 1, wherein
   the peaks originating from the diamond comprise a nanodiamond peak originating from nanodiamond at least at the center portion, and
   a peak intensity ratio of the nanodiamond at the center portion is greater than a peak intensity ratio of the nanodiamond at the peripheral portion.
3. The cutting tool according to claim 1, wherein
   the peaks originating from the diamond comprise an SP2 peak originating from graphite at least at the center portion, and
   a peak intensity ratio of the SP2 peak at the center portion is greater than a peak intensity ratio of the SP2 peak at the peripheral portion.
4. The cutting tool according to claim 1, wherein a thickness of the coating layer at the tip portion of the base body is less than a thickness of the coating layer at a rearward portion of the base body.
5. A method for manufacturing a cut product, comprising the steps of:
   rotating the cutting tool according to claim 1 about a rotation axis thereof;
   bringing the cutting edge of the cutting tool that is rotating into contact with the workpiece; and
   moving the cutting tool away from the workpiece.

* * * * *